United States Patent
Marzano

(10) Patent No.: US 6,930,413 B2
(45) Date of Patent: Aug. 16, 2005

(54) LINEAR SYNCHRONOUS MOTOR WITH MULTIPLE TIME CONSTANT CIRCUITS, A SECONDARY SYNCHRONOUS STATOR MEMBER AND IMPROVED METHOD FOR MOUNTING PERMANENT MAGNETS

(75) Inventor: Domenic P. Marzano, New Castle, PA (US)

(73) Assignee: Velocity Magnetics, Inc., New Castle, PA (US)

( * ) Notice: Subject to any disclaimer, the term of this patent is extended or adjusted under 35 U.S.C. 154(b) by 143 days.

(21) Appl. No.: 10/444,534

(22) Filed: May 23, 2003

(65) Prior Publication Data

US 2004/0070286 A1 Apr. 15, 2004

Related U.S. Application Data

(60) Provisional application No. 60/390,244, filed on Jun. 20, 2002, and provisional application No. 60/383,066, filed on May 24, 2002.

(51) Int. Cl.[7] .............................................. H02K 41/00
(52) U.S. Cl. ......................................... 310/12; 310/98
(58) Field of Search .................................... 310/12–14

(56) References Cited

U.S. PATENT DOCUMENTS

| | | | | |
|---|---|---|---|---|
| 4,767,954 A | * | 8/1988 | Phillips ........................ | 310/12 |
| 5,479,145 A | * | 12/1995 | Kalsi ........................... | 335/297 |
| 5,757,091 A | * | 5/1998 | Sogabe et al. ................. | 310/12 |
| 5,952,742 A | | 9/1999 | Stoiber et al. ................. | 310/12 |
| 6,062,350 A | | 5/2000 | Spieldiener et al. ......... | 188/161 |
| 6,326,708 B1 | | 12/2001 | Tsuboi et al. ................. | 310/12 |
| 6,417,584 B1 | * | 7/2002 | Chitayat ....................... | 310/12 |
| 6,703,754 B1 | * | 3/2004 | Finkenbinder et al. ...... | 310/227 |

FOREIGN PATENT DOCUMENTS

| | | |
|---|---|---|
| DE | 41 37 201 A 1 | 5/1993 |
| EP | 0 959 949 A1 | 5/1998 |
| JP | 57151263 | 9/1982 |
| JP | 59172967 | 9/1984 |
| WO | 433408 | 8/1935 |
| WO | WO 02/07291 A1 | 1/2002 |

* cited by examiner

*Primary Examiner*—Thanh Lam
*Assistant Examiner*—Judson H. Jones
(74) *Attorney, Agent, or Firm*—John A. Monocello, III; Cohan & Grigsby, P.C.

(57) ABSTRACT

The linear synchronous motor consists of a specific primary and secondary part. The secondary portion is a ferromagnetic back plate. An array of permanent magnets are attached to the back plate so that a fixed or variable pole pitch occurs in a precise manner between at least two magnets of alternating polarity which improves existing methods for attaching, guiding, protecting and enhancing the overall flux array produced and emitted by the permanent magnets. A one-piece electrically synchronous linear secondary stator member accompanies a primary member, the synchronous linear permanent magnet motor. The stator electrical frequency is customizeable to allow for a wide variety of braking applications.

33 Claims, 16 Drawing Sheets

TRANSIENT MOTION ns which will accompany a primary member, the synchronous linear permanent magnet motor. The system of the present invention provides a variable stator electrical frequency as the primary permanent magnet synchronous motor enters the synchronous linear stator member at a particular velocity, wherein the electrical frequency along the synchronous linear stator member diminishes as vehicle velocity fades. The stator member has narrow slots which provide a pole pitch spacing that corresponds with the pole pitch spacing of the permanent magnet linear synchronous primary member. The slotting of the secondary stator causes the electrical currents in the stator to move through discrete pathways during transient dynamic excitation. The electrical frequency can be adjusted by increasing or decreasing the identical pole pitch spacing of both the primary and secondary members, thereby allowing a variable braking force throughout the entire active braking area.

LINEAR SYNCHRONOUS MOTOR WITH MULTIPLE TIME CONSTANT CIRCUITS, A SECONDARY SYNCHRONOUS STATOR MEMBER AND IMPROVED METHOD FOR MOUNTING PERMANENT MAGNETS

CROSS REFERENCE

This utility application claims priority to U.S. Provisional Patent Application Ser. No. 60/383,066 filed May 24, 2002 and U.S. Provisional Patent Application Ser. No. 60/390,244 filed Jun. 20, 2002.

FIELD OF THE INVENTION

The invention relates to linear synchronous motors, and in particular to linear synchronous motors with multiple time constant circuits and an improved method of mounting permanent magnets. An embodiment provides an electrically synchronous linear secondary stator member that accompanies a primary member, the synchronous linear permanent magnet motor. An embodiment is utilized as an electrodynamic brake for elevators as well as amusement rides such as drop towers, roller coasters and any other mobile device that requires dependable and high thrust braking applications.

BACKGROUND OF THE INVENTION

This invention reduces or eliminates specialized tooling to attach, guide and secure into place several permanent magnets with alternating poles, situated side by side by incorporating these features into a ferromagnetic back plate and one-piece double laminated frame and cover system. In doing so, the invention eliminates the need for use of raised individual spacers, individual frame pieces and guide pins which have been utilized in previous art.

The invention improves upon existing methods of permanent magnet electro-dynamic braking. In an embodiment the system is completely synchronous. It does not operate as an eddy current induction type electrical device. The synchronous system operates differently than existing eddy current induction type brakes by directing the electrical currents into discrete circuit pathways thereby routing currents in a particular pathway along the synchronous stator. The stator electrical frequency of this system can be customized, meaning increased or decreased, for any given application, thereby allowing a variable braking force throughout the entire active braking area. This is not possible with existing solid induction type, linear stator rails made from conductive material. This allows for a wide variety of braking applications.

SUMMARY OF THE INVENTION

The invention provides a synchronous linear electrical machine operating as a motor or an electrodynamic brake consisting of an array of at least two permanent magnets of alternating polarity. The magnets are attached to a ferromagnetic back plate that has precision machined pockets to accept the permanent magnets in such a manner that will allow for accurate pole pitch spacing along the magnetic array. The pockets, surround and keep the highly attractive magnets in place; a one-piece non-ferromagnetic conductive material, ladder type, frame laminated to an identical one-piece conductive type frame and then welded into a non-magnetic case. The frames are blind drilled and tapped to match the bolt pattern of the ferromagnetic back plate.

In an embodiment, the invention provides a synchronous linear secondary stator member that is electrically synchro-

BRIEF DESCRIPTION OF THE DETAILED DRAWINGS

Figure 12A:
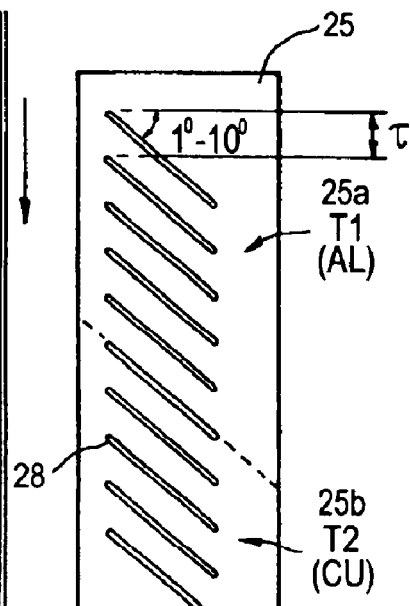
Figure 12C:
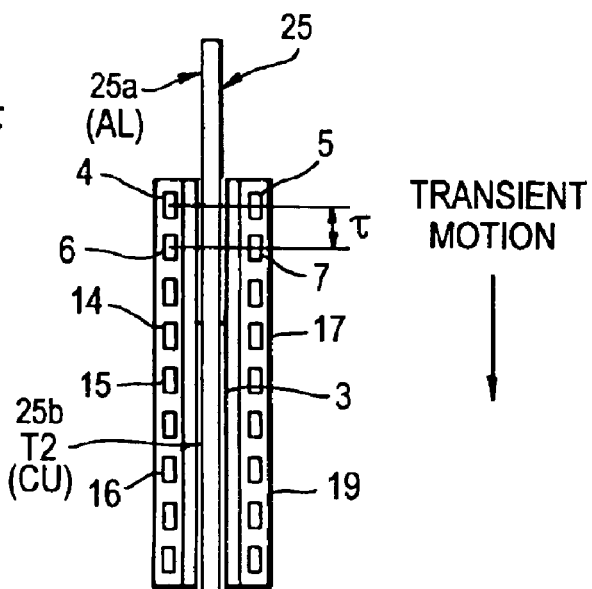

FIGS. 12a, b, c and d are side views of embodiments of the stator member. FIG. 12c is a cross-sectional depiction of the synchronous motor with the stator member in the center and showing time constant one (T1) Al and time constant two (T2) copper. FIG. 12a depicts time constants one and two (Al and Cu respectively), current direction and slot pole pitch.

Figure 13:
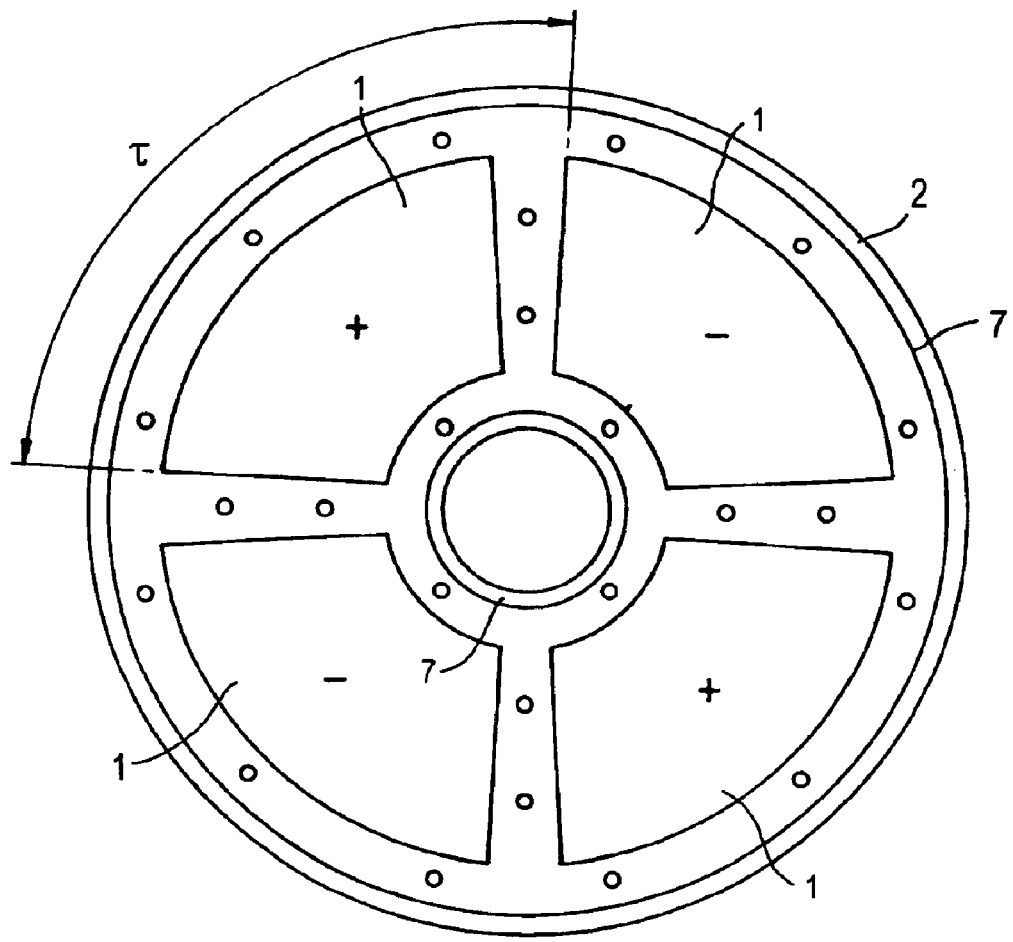

FIG. 13 top view illustration of the primary synchronous rotary motor showing a four pole alternating magnetic array and the ferrous magnetic back plate.

Figure 14:
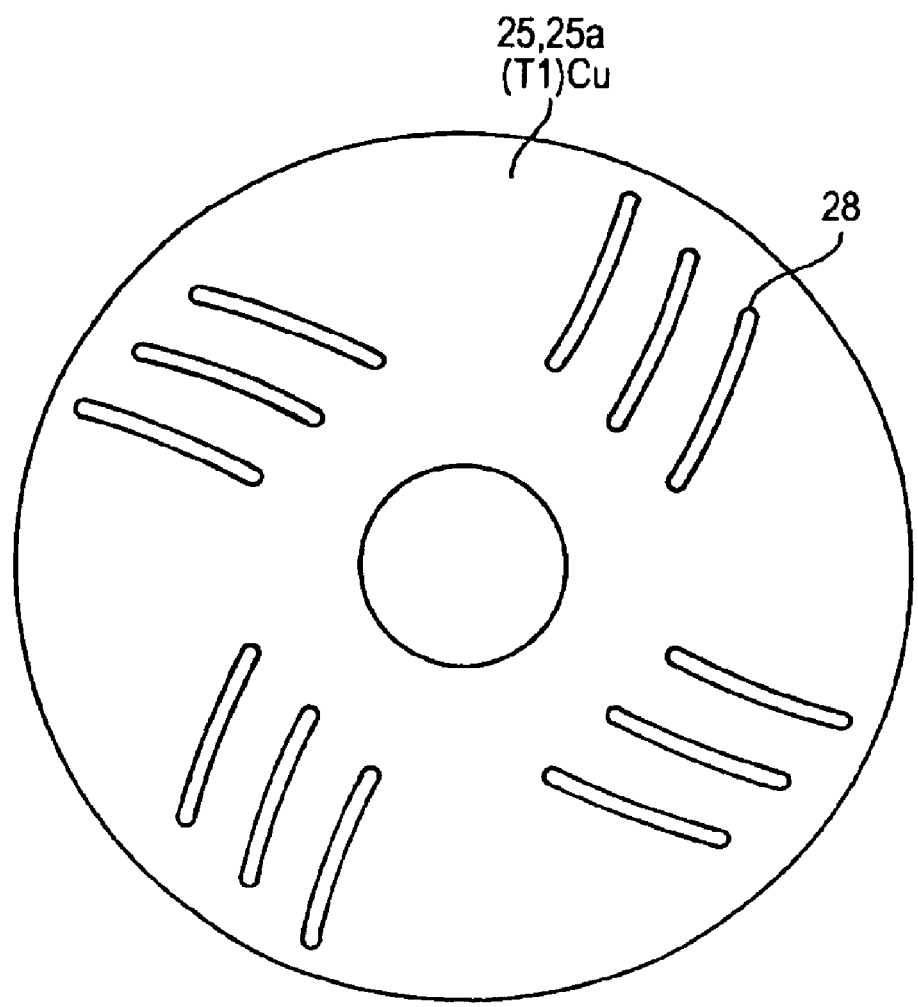

FIG. 14 shows a top view illustration of top view secondary synchronous rotary disk.

Figure 15:
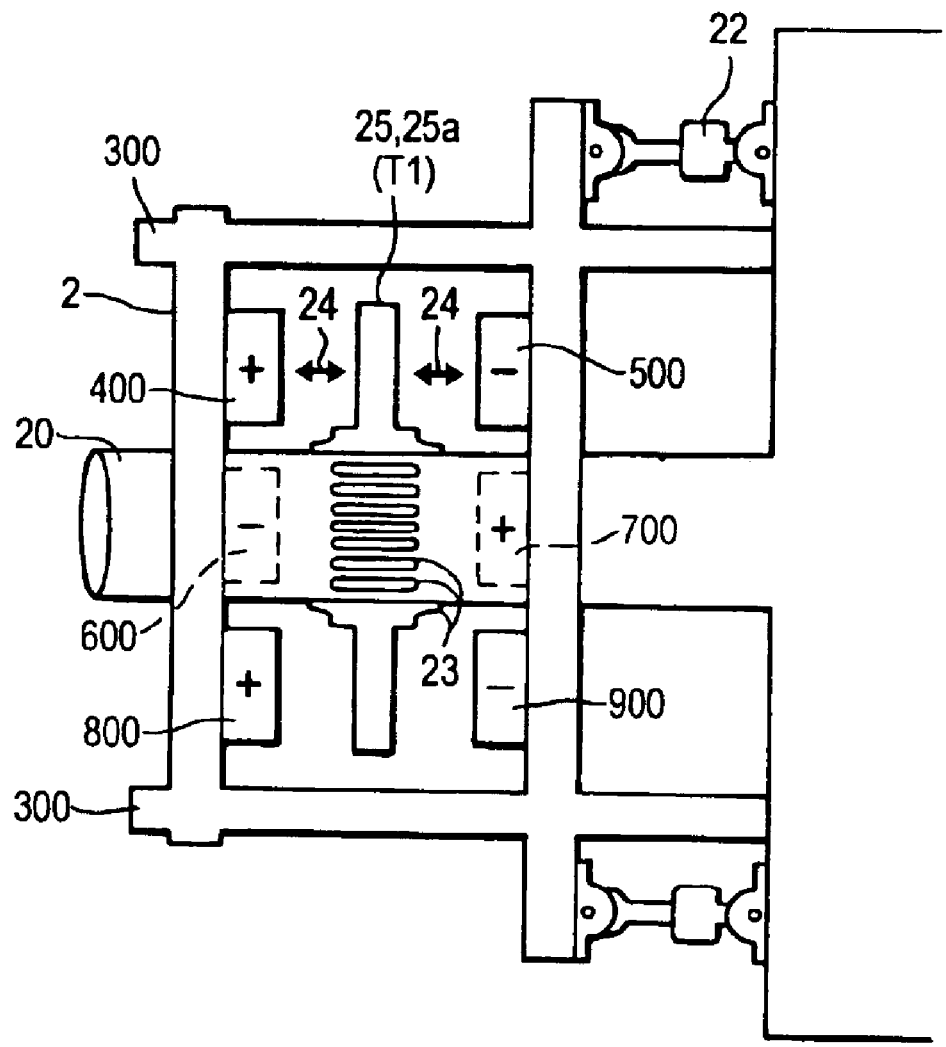

FIG. 15 shows a side view illustration of a shaft with a secondary synchronous stator disc splined in the center and the primary synchronous permanent magnet rotary motor on each side of the secondary member which is shown to being guided by a slide type mechanism.

Figure 16:
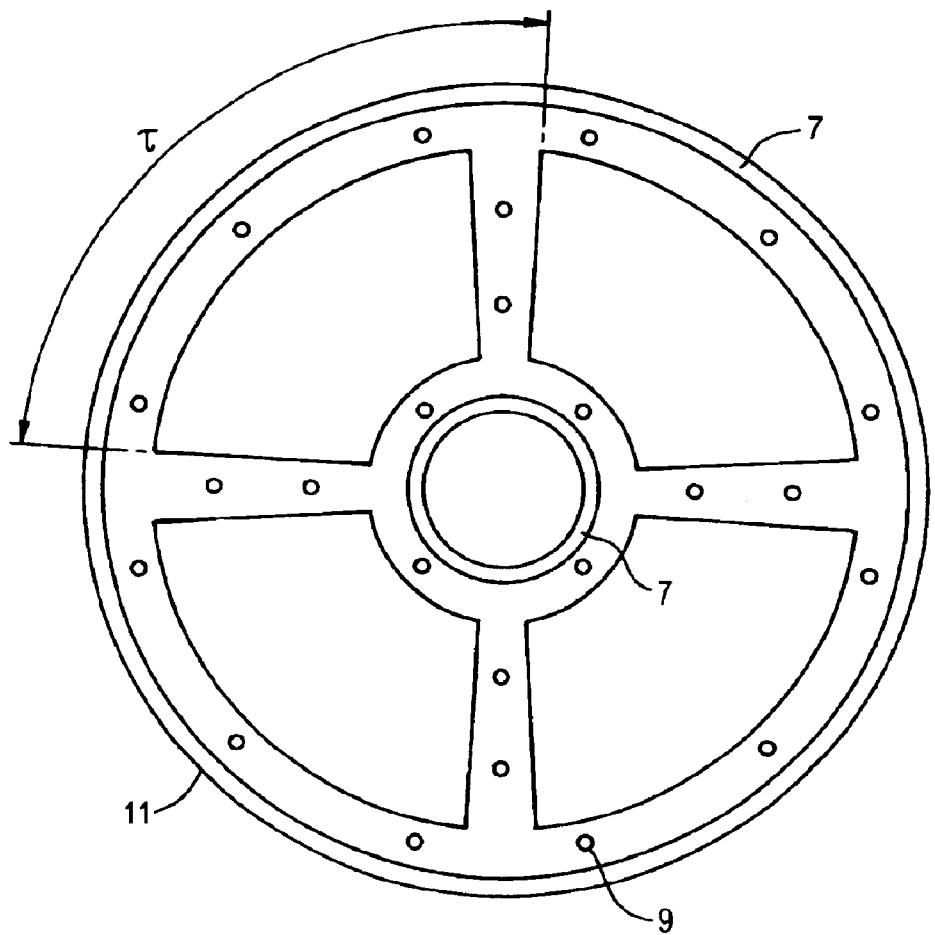

FIG. 16 is a top view illustration of the machine one-piece highly conductive cover that bolts to the rotary ferromagnetic back plate.

DETAILED DESCRIPTION OF THE PRESENTLY PREFERRED EMBODIMENTS

Figure 1:
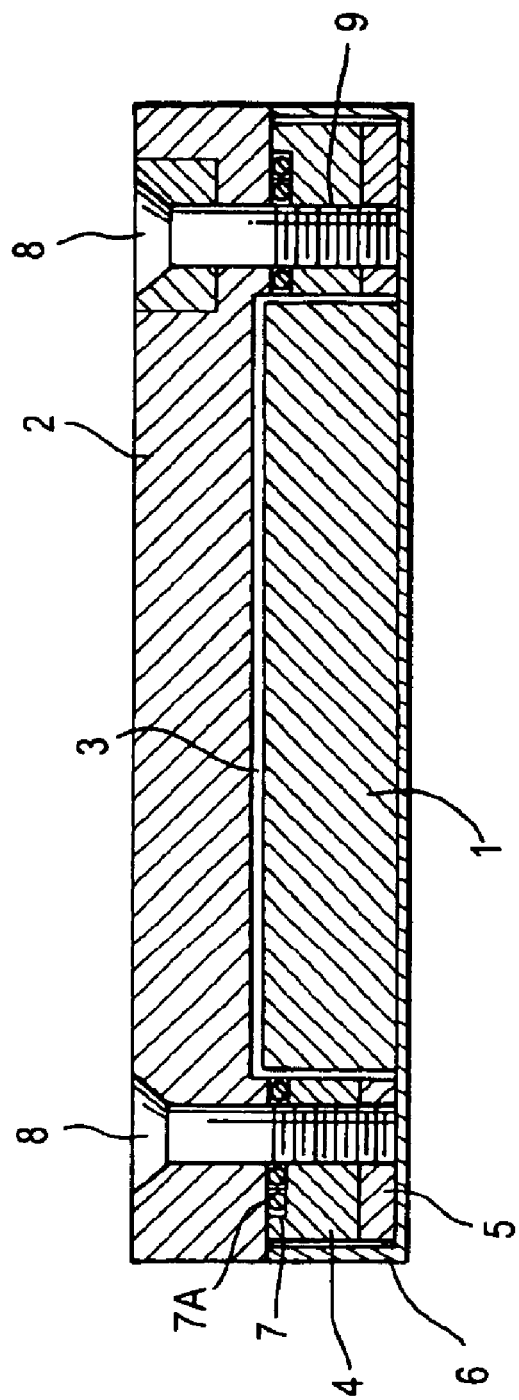
FIG. 1 is a latitude cross section view of the assembly showing the ferromagnetic back plate with the machined magnet pockets, the non-ferromagnetic conductive type frame with the o'ring seal groove, the conductive type material frame, the encapsulating case that welds to the frames, the magnet and the flat head or capscrew countersunk non-magnetic bolts.
Figure 2:
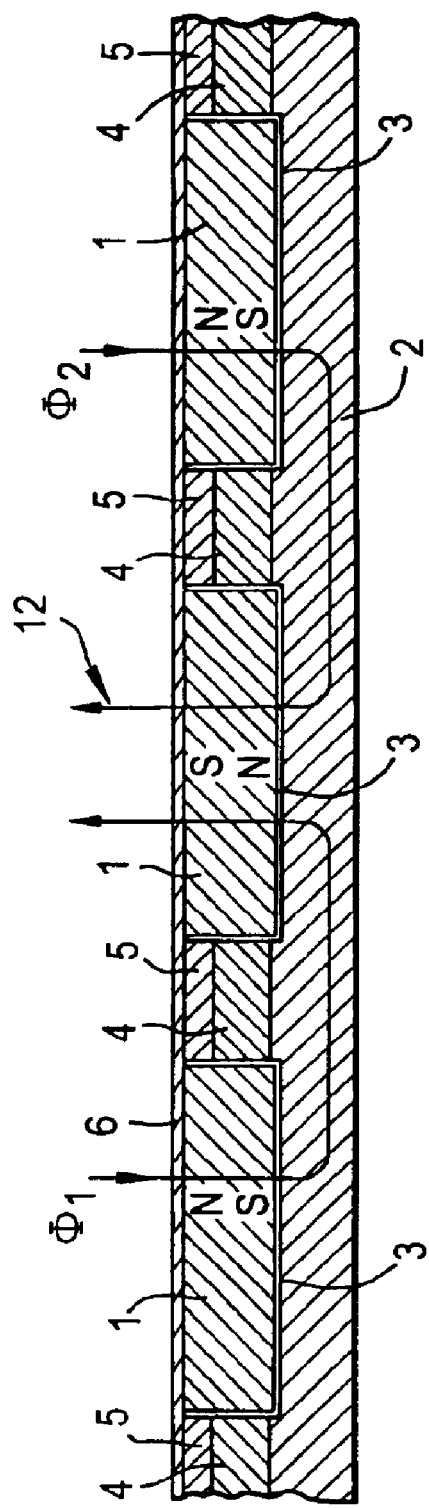
FIG. 2 is a longitudinal cross section view of the assembly, illustrating the magnet pole arrangement, the flux path circuit, the machined magnet pockets and the perspective frames.
Figure 3:
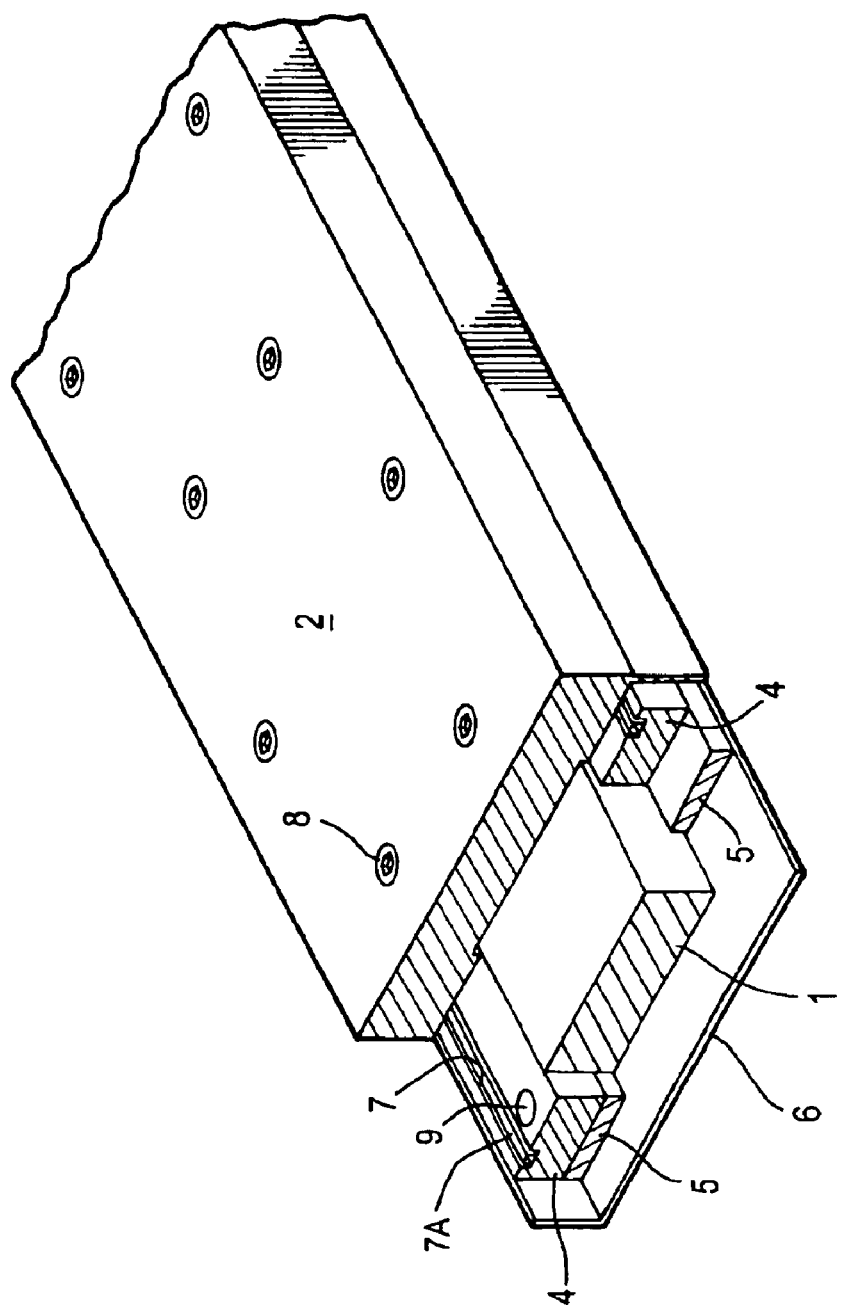
FIG. 3 illustrates a cutaway of the ferromagnetic back plate, the magnet, the bolt pattern, the non-ferromagnetic conductive frame and o'ring seal groove, the conductive frame and the encapsulating case that welds to the frames.
Figure 4:
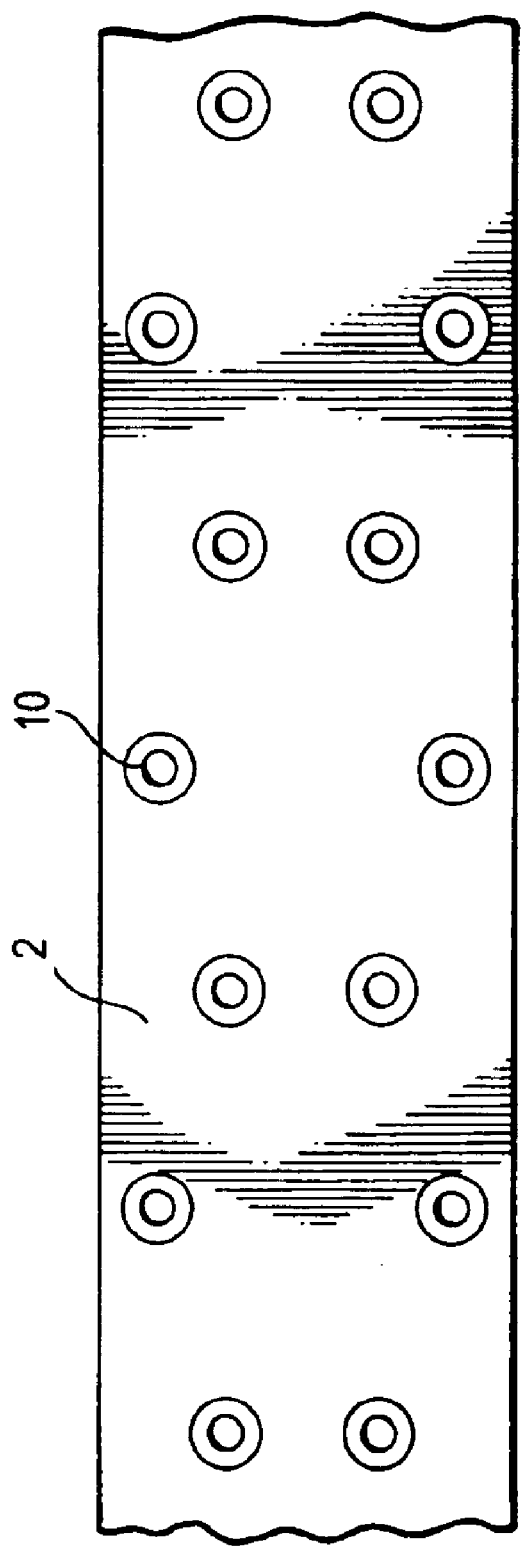
FIG. 4 illustrates the ferromagnetic back plate and the bolt pattern.
Figure 5:
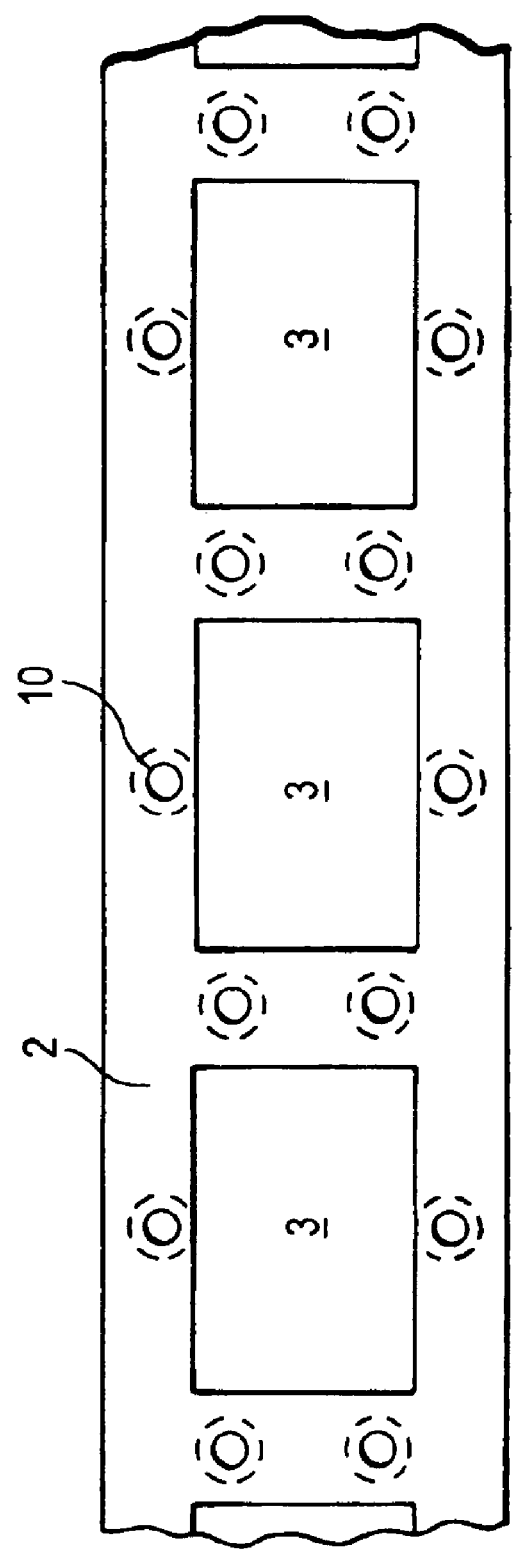
FIG. 5 illustrates a top view of the ferromagnetic back plate and the magnet retaining pockets.
Figure 6:
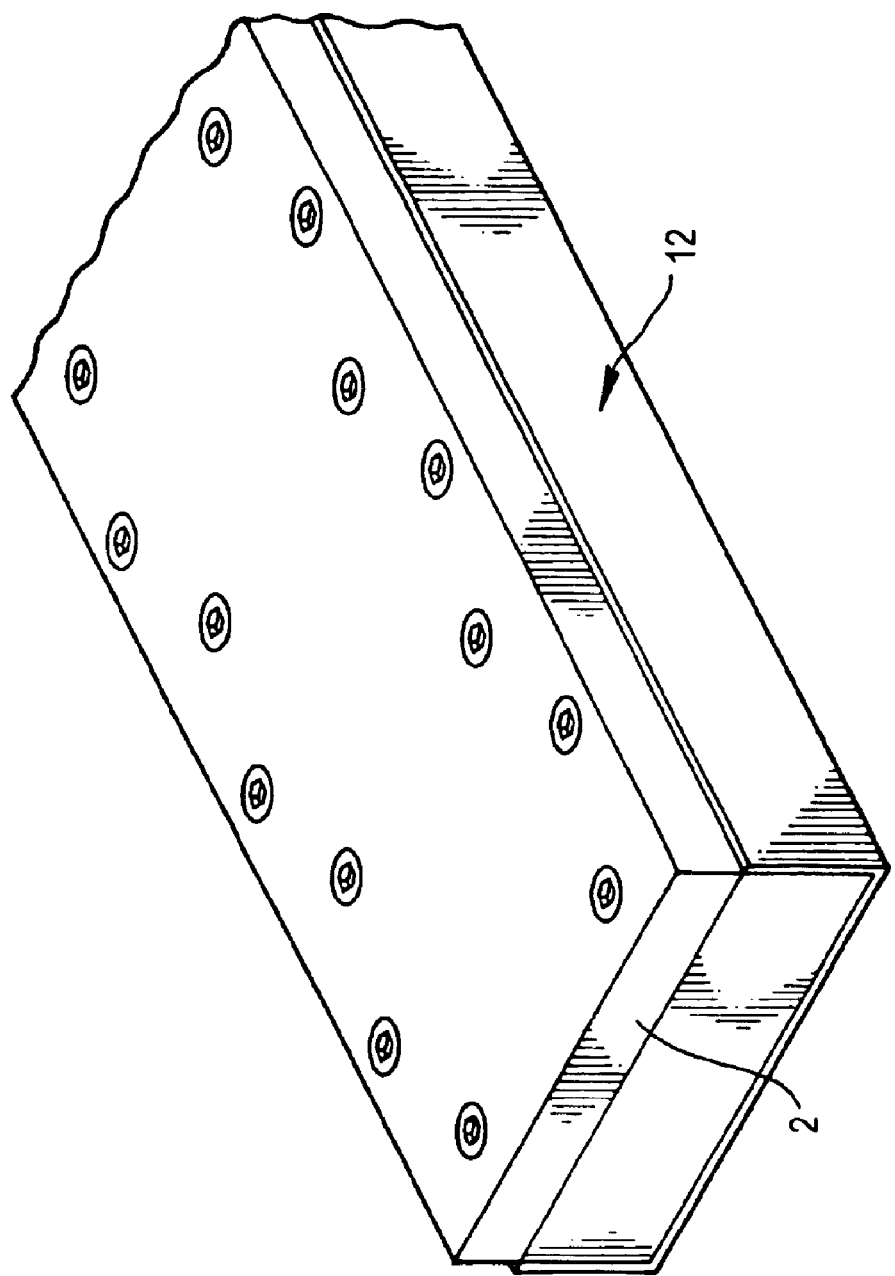
FIG. 6 illustrates the ferromagnetic back plate and frame and case as an assembly.

As shown in FIGS. 1–3, the device for surrounding, guiding and covering the permanent magnet array 1, comprises a frame 4, preferably made of stainless steel, which is laminated to another frame 5, preferably made of a conductive type element such as copper or aluminum or any other highly conductive material. The laminated frames 4, 5 are welded into a corrosive resistant, non-magnetic stainless steel case 6. The desired pole pitch spacing is determined by the dimensions of this double frame and cover 4, 5, 6. The frame is drilled and blind tapped 9 to accept the ferromagnetic back plate 2. The back plate 2 has a matching countersunk bolt pattern. The stainless steel portion of the frame 4 provides the surface that mates to the ferromagnetic back plate 2. This stainless steel surface 4 or the surface of the ferromagnetic back plate 2 contains an o'ring seal groove 7 precision machined around the entire perimeter and bolt holes to accept an o'ring seal 7a, preferably made of rubber, to provide a watertight seal when the frame and cover 4, 5, 6 are bolted to the ferromagnetic back plate 2, due to the intolerance of the permanent magnets to aqueous and corrosive environments.

Two means are incorporated into the frames 4, 5 and ferromagnetic back plate 2 for ensuring the precise alignment of the permanent magnet array 1. The first is provided by the laminated frames 4, 5 and the second is provided by the ferromagnetic back plate 2. The depth or elevation of the frames 4, 5 are designed to match the elevation of the permanent magnet array 1, and the one-piece segmented double frame 4, 5 is dimensioned and machined to match the pole pitch of the magnet array 1. The pole pitch spacing between each individual magnet 1 will be identical to the spacing of segments of the one-piece double frame/cover 4, 5, 6. The back plate 2 contains precision machined pockets 3 to accept the permanent magnet array 1. The counter sunk pockets 3 are machined to a slight oversized dimension of the magnet 1. The magnets 1 are preferably attached by means of epoxy adhesive to the ferromagnetic back plate 2 within the pockets 3. The machined pockets 3 will not allow the magnets 1 to slide back and forth or attract one another, due to their alternating pole arrangement. Therefore, the magnet array 1 can be attached to the ferromagnetic back plate 2 so that the one-piece double frame/case 4, 5, 6 can be attached at any given time thereafter. The double frame/case 4, 5, 6 provides a protective barrier between the magnetic array 1 and other external influences such as water, salt mist, corrosive contamination, metal objects and dirt and debris.

The one-piece conductive frame 5 that is laminated to the one-piece stainless frame 4 will surround the upper portion of each magnet 1 such that the conductive frame 5 will enhance the flux field 11, 12 emitted by the permanent magnet array 1 by at least 5% or greater when introduced to a secondary stator portion. The conductive frame 5 will also reduce spatial harmonics that commonly occur during transient dynamic motion and high force application.

Figure 7:
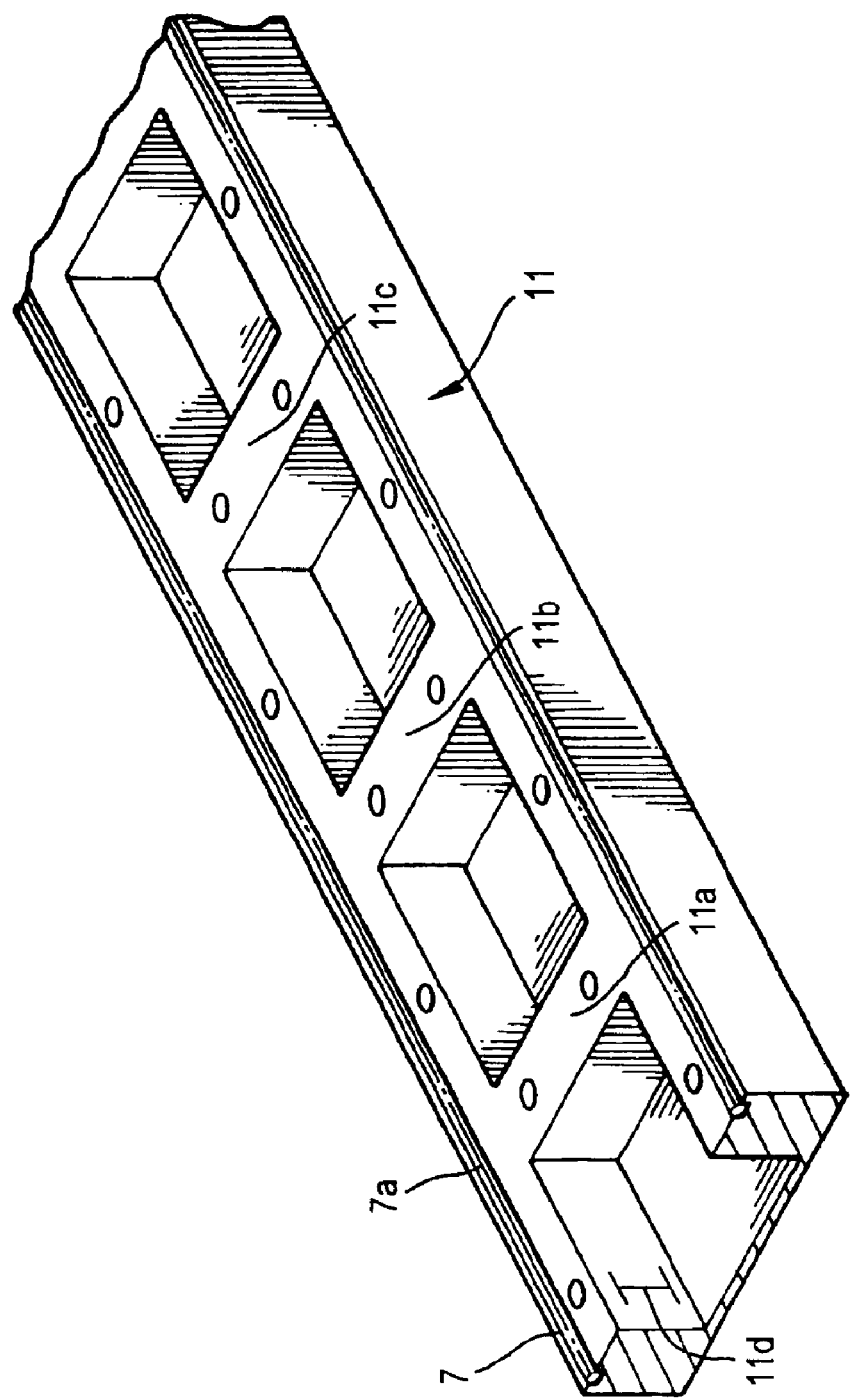
FIG. 7 is a three dimensional cutaway drawing showing the cast or extruded, machined one piece conductive type alloy frame/cover and the o'ring seal groove.
Figure 8:
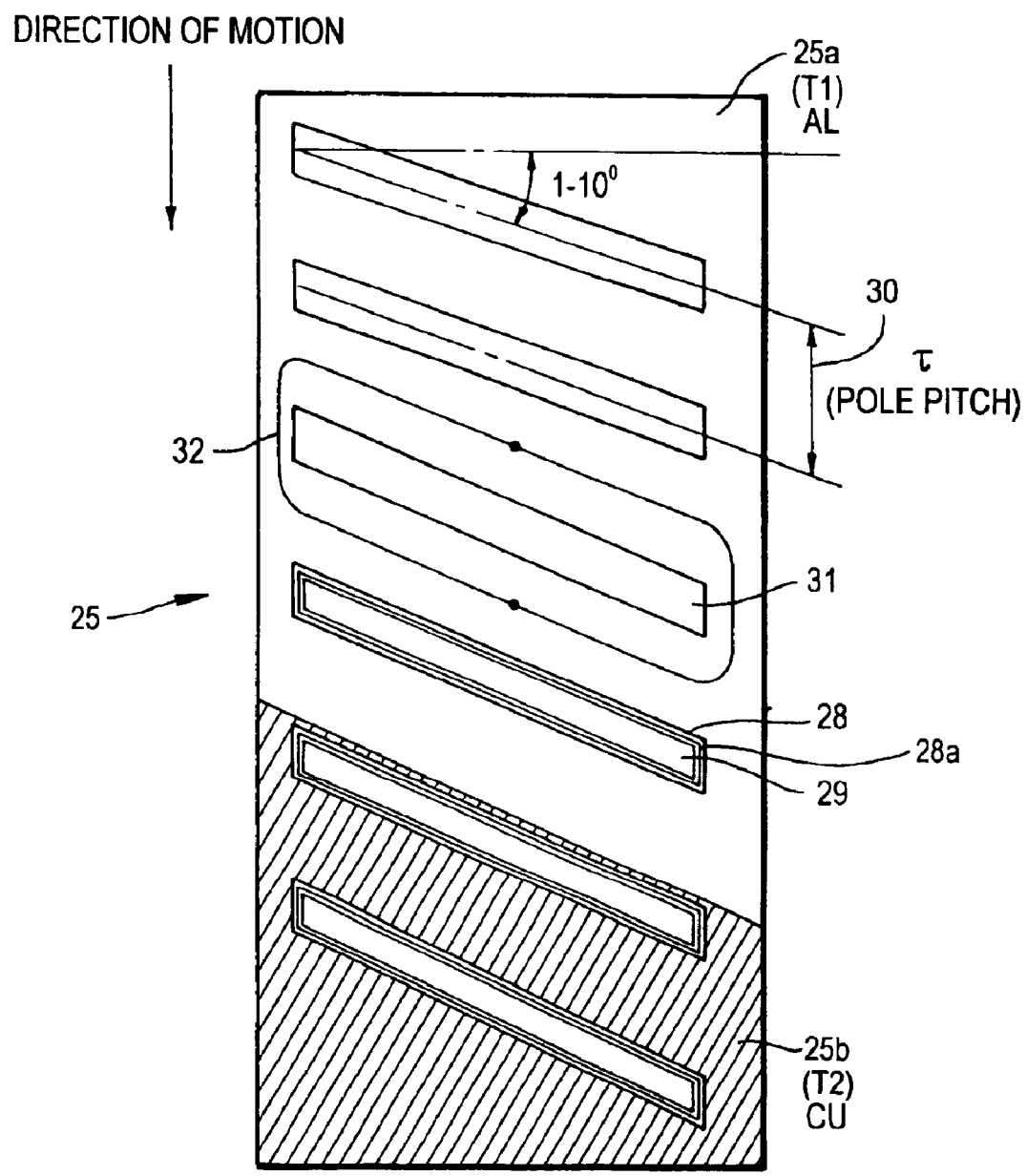
FIG. 8 illustrates a cross-sectional view of the synchronous linear secondary stator member with narrow slots cut out at a 5–10 degree angle.

As shown in FIG. 7, the above described double frame and stainless steel case 4, 5, 6 can also be cast as a one-piece alloy frame and case 11 or machined as such from a solid billet of extruded conductive material. The casting material utilized is a proprietary conductive type alloy. The one-piece cast design 11 acts as a case and frame. The frame 11 will consist of ladder type segments 11a, 11b, 11c that will maintain the desired pole pitch spacing between each magnet 1. The elevation 11d of the one-piece frame/case 11 will again be determined by the elevation of the permanent magnet array 1. The permanent magnet array 1 will consist of at least two or more permanent magnets with alternating polarity as shown in FIG. 2. This one-piece cast alloy frame 11 will also act as the shading or dampening frame to reduce spatial harmonics, flux leakage and flux fringing as previously mentioned by at least 5%. The surface of the frame 11 which mates to the ferromagnetic back plate 2 is precision machined with an o'ring seal groove 7 to accept an o'ring seal 7a, preferably rubber, that may be the round or square type. The ferromagnetic back plate 2 again contains precision machined pockets 3 to accept the permanent magnet array 1. The pockets 3 will be spaced accordingly to provide the desired pole pitch spacing 11a, 11b, 11c between each magnet 1. Again, the cast allow or extrude frame/cover 11 may be bolted to the ferromagnetic back plate 2 at any given time without damaging or altering the desired pole spacing between the permanent magnet array.

In an embodiment, the invention consists of a one-piece linear stator rail 25 constructed of at least one layer of conductive material such as brass, copper, aluminum, beryllium copper, titanium or any other highly conductive alloy or material. The above material can be laminated, one on top of the other, as illustrated in FIGS. 8, 9, 10, 12a, 12c. By laminating more than one conductive material, a variable electro-dynamic brake drag will occur along the secondary stator member 25 as a function of time wherein copper would provide (25a) aluminum (25b) brass, also referred to as (t1) and (t2) respectively.

Figure 9:
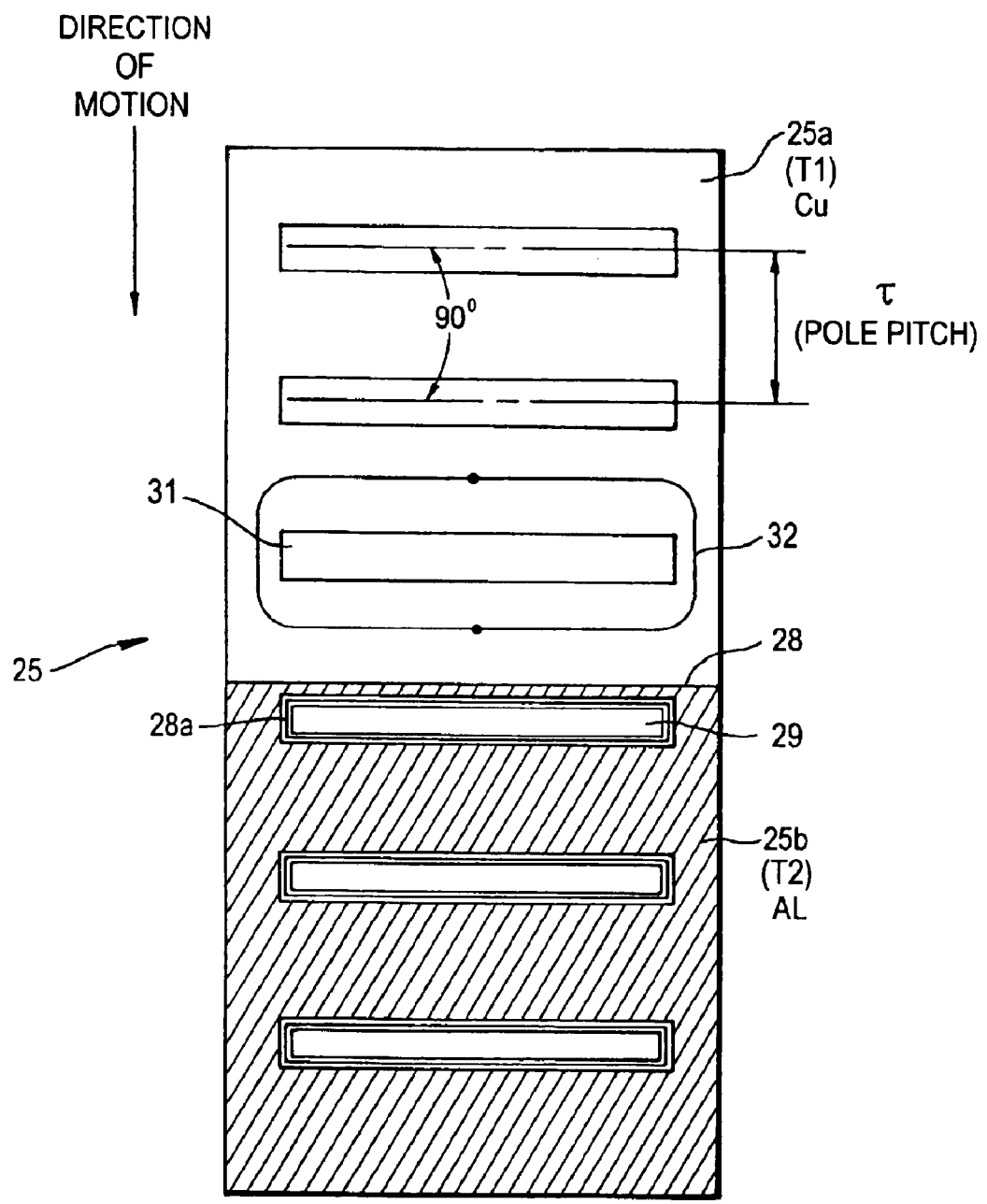
FIG. 9 illustrates a cross-sectional view of the synchronous linear secondary stator member with narrow slots cut out at a 90 degree angle.
Figure 10:
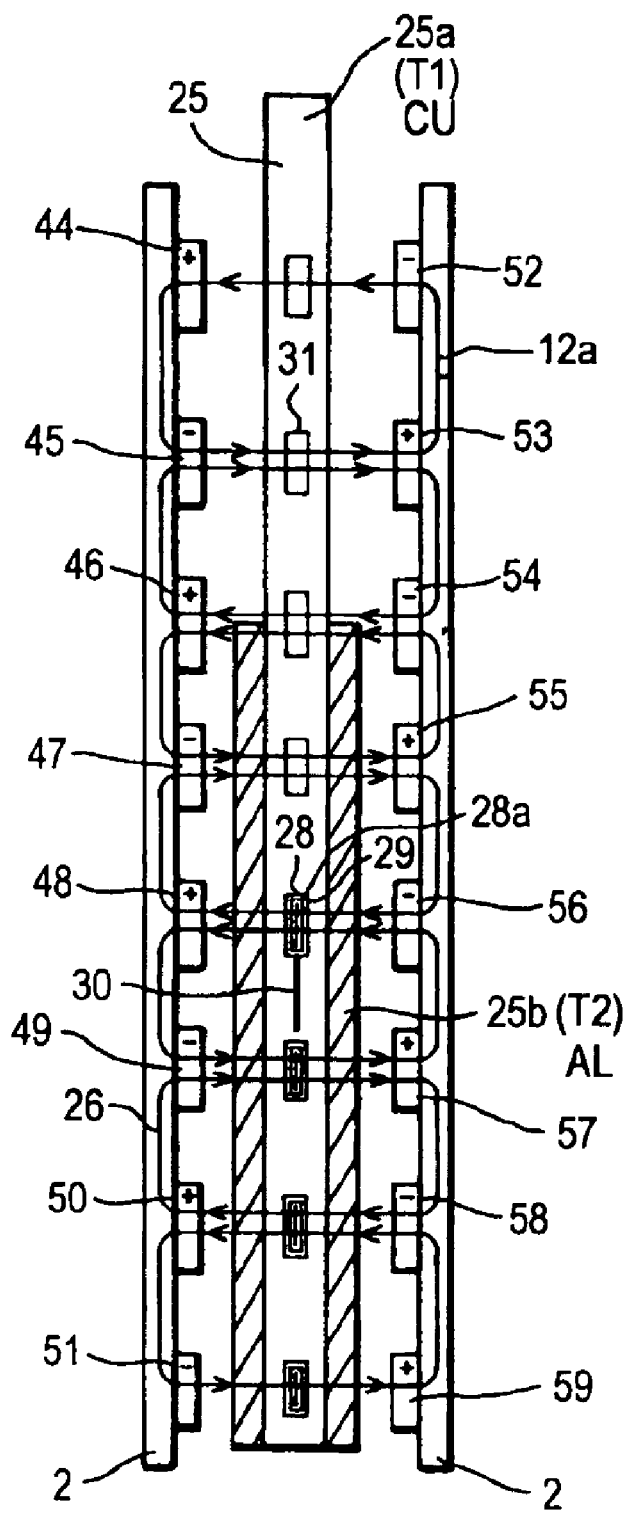
FIG. 10 illustrates a cross-sectional view of the preferred embodiment of the braking system, which includes the primary synchronous linear permanent magnet motor and the synchronous linear secondary stator member.
Figure 11:
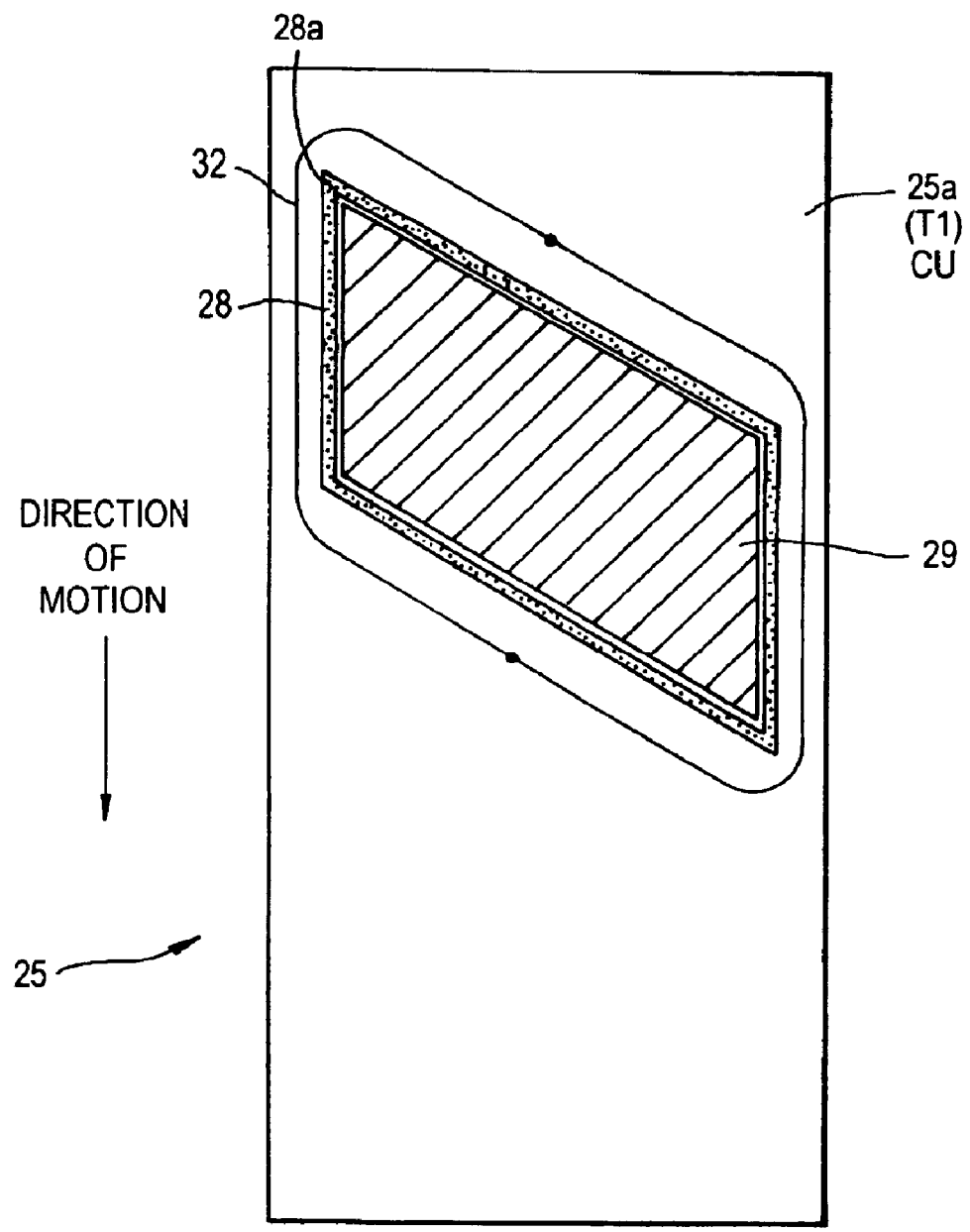
FIG. 11 illustrates an enlarged view of the one-piece synchronous linear secondary stator member having one enlarged narrow slot with a non-conductive insulating barrier around the inside edge of the slot, the highly permeable steel or ferrite core within the slot and the discrete synchronous current loop.

Narrow slots 28 (shown in FIGS. 8, 9, 10, 11, 12a, 12b, 12d, and 14) cut out at a 1–10 degree angle, the pole pitch spacing, the discrete synchronous current loop 32 (shown in FIGS. 8, 9, 10, and 12d), the non-conductive barrier around the inside edge of the slot 28a (shown in 8, 9, 10, 11, 12d), the highly permeable steel or ferrite core 29 (shown in 8, 9, 10, 11, 12d) within the slot 28 (shown in 8, 9, 10, 12a, 12c) and two one-piece dissimilar conductive layers, shown as (t1) aluminum and (t2) copper. The synchronous linear secondary stator member comprises narrow slots 28 (shown in FIG. 9) cut out at a 90 degree angle, the pole pitch spacing 30 (shown as 11a, b, c, previously in FIG. 7), the discrete synchronous current loop 32, the nonconductive insulation barrier 28a around the inside edge of the slot, the highly permeable steel or ferrite core 29 within the slot and two one-piece dissimilar conductive layers, shown as 25a (t1) copper and 25b (t2) aluminum. FIG. 10 illustrates a cross-sectional view of the preferred embodiment of the braking system, which includes the primary synchronous linear permanent magnet motor with a ferromagnetic back plate 2 and eight alternating negative and positive magnets 44–51, and 52–59 and the flux path 12 return circuits that travel through the secondary member 25. The illustration also includes the double-layered synchronous linear secondary stator member 25a, b showing a cross-sectional view of the narrow slots 28 and how the pole pitch 30 of the slots, match the pole pitch 30 of the alternating permanent magnets 44–51 and 52–59. FIG. 11 illustrates an enlarged view of the one-piece synchronous linear secondary stator member 25 having one (enlarged for illustration) narrow slot 28 with a non-conductive insulating barrier 28a around the inside edge of the slot, the highly permeable steel 12 or ferrite core 29 within the slot 28 and the discrete synchronous current loop 32.

Figure 12B:
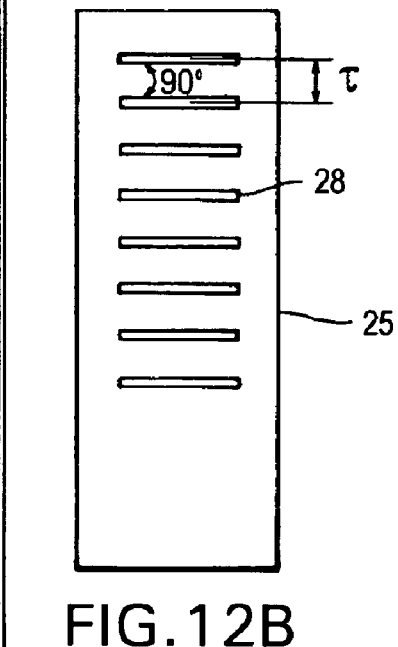
Figure 12D:
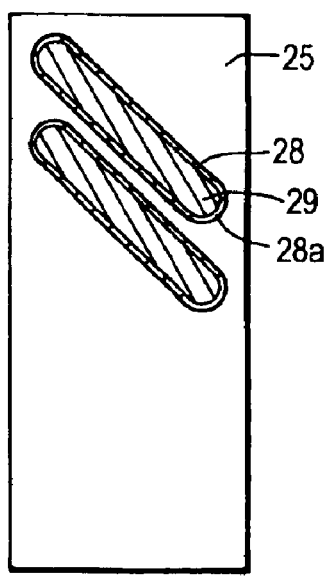

The stator member 25 has narrow slots cut out along the Y-axis at a pre-determined pole pitch 30. The narrow slots 28 provide at least two purposes. One purpose is to direct the electrical currents to run in a synchronized and discrete pathway 32 along the secondary stator member 25 during transient dynamic motion as the synchronous linear permanent magnet motor enters said stator 25. The second purpose of the slotting is to allow for the installation of a small highly permeable steel or ferrite core 29, when use of such core is desired. However, ferrite core slot inserts 29 are not required. In an embodiment, the steel or ferrite core 29 is surrounded by an electrical insulating type material 28a such as nylon 6/6, fiberglass G-10, fiberglass insulating tape or any other insulating type barrier. Therein the steel or ferrite core 29 will not touch the edges of the conductive stator rail 25 once installed. The insulated material 28a between the core 29 and the conductive stator 25 will prevent electrical shorts during excitation. The steel or ferrite core 29, as shown in FIGS. 8, 9, 10, 11 and 12d, is utilized to maintain or increase the magneto-motive force between the air gap of the double sided linear synchronous permanent magnet primary member during high and low speed dynamic excitation. The narrow slots 28 that are cut into the secondary stator member 25 along the Y-axis are slotted at about a 1 to 10 degree angle to eliminate brake pulsation along the active brake area. The narrow slots 28 may also be slotted at a 90 degree angle along the active braking area as illustrated in FIGS. 9 and 12b. Narrow slots 28 create a higher electrodynamic drag coefficient than the use of wide slots. In an example, the secondary synchronous linear stator member 25 does not consist of any other steel or ferrous material other than the highly permeable steel or ferrite core 29 that is utilized within the narrow slots 28. To reduce initial braking "jerk rate" as the moving vehicle enters the synchronous linear secondary member 25, a particular number of the highly permeable steel or ferrite cores 29 may be removed from the initial entry of the active braking area or left out all together as illustrated in FIGS. 8, 9, 10, 12a, 12b and 14.

The primary member in an embodiment consists of a double sided linear synchronous motor consisting of at least two permanent magnets of negative and positive polarity situated on opposite sides of the secondary stator member (transverse axis) as illustrated in FIG. 10, for example. Magnets 44, 46, 48, and 50, and 53, 55, 57 and 59 as illustrated in FIG. 10 are arranged so as to face positive and magnets 45, 47, 49, and 51 and 52, 54, 56 and 58 are arranged so as to face negative. This arrangement allows a flux return circuit 12 to occur through the secondary stator member 25. FIG. 10 illustrates an eight pole permanent magnet configuration wherein the pole pitch 30 of the permanent magnets along the transverse-axis will match the pole pitch 30 of the secondary synchronous stator member along the same transverse-axis, wherein a distinct synchronous electrical circuit path 12 will occur during transient dynamic excitation. The pole pitch of the frequency of the synchronous primary permanent magnet member and the secondary synchronous stator member 25 will depend on the entry velocity of the object or vehicle being stopped or slowed down. In other words, the electrical frequency of the secondary synchronous stator member 25 can be tuned to a particular frequency (Hertz) at vehicle entry by expressing, Vs/2Tp=f, where Tp is the pole pitch of the linear synchronous permanent magnet member in meters and Vs is the entry velocity of the vehicle, and f is the frequency produced in Hertz. As the braking force fades or decays, the electrical frequency along the linear secondary synchronous stator member 25 diminishes accordingly.

The primary synchronous permanent magnet member may be affixed to the non-stationary vehicle or may be affixed in a stationary manner along the vehicle pathway. As well, the secondary synchronous stator member 25 may be affixed to the non-stationary vehicle or may be fixed in a stationary manner along the vehicle pathway.

The described synchronous linear permanent magnet braking device has also been designed so as to function in a rotational manner as well as shown in 13–16. This application would provide a means of energy dissipation by reducing kinetic energy along a rotating shaft, 20, gear assembly, axle or any other rotating device requiring the reduction or total decay of rotational movement.

The aforementioned linear primary synchronous permanent magnet motor will continue to be arranged so that the alternating positive and negative permanent magnet array will be affixed 360 degrees around a disc shaped ferromagnetic back plate, 2, where in an opposite array of permanent magnets, 400, 500, 600, 700, 800 and 900 face one another in an opposite polarity configuration. This configuration will consist of at least two permanent magnets of alternating polarity. The disc shaped ferromagnetic back plates 2 will be affixed to a slide assembly 300. This slide assembly 300 will allow the opposing disc shaped synchronous permanent magnetic assemblies to remain aligned with one another along the transverse axis. The slide assemblies 300 will also allow transverse or perpendicular movement of each opposing back plate 2 thereby allowing for an adjustable magnetic air gap 24. The disc shaped synchronous permanent magnet assemblies may be controlled and adjusted by means of an air or hydraulic cylinder(s) 22 linear actuators, manual pivoting lever or any other mechanical or electrical means to control or variate the width of the air gap, 24.

Between the magnetic air gap 24 of the opposing synchronous permanent magnet array, 400, 500, 600, 700, 800 and 900 will be the secondary synchronous stator member 25. This disc consists of a single layer or multiple layers of a conductive material, wherein the multiple layers of conductive material will cause a variable electro-dynamic drag to occur as a function of time throughout the braking cycle. The synchronous secondary stator member 25 will have slots 28 as shown in FIG. 14 cut through a portion of the Y-axis along the active braking area To reduce braking pulsation during a brake cycle, the slots, 28 will be cut to at least a 1 degree angle, degrees along the transverse axis of the aforementioned stator member 25.

The invention can also be configured to where the secondary synchronous stator member 23 would be attached in a stationary manner to prevent rotation. The primary synchronous permanent magnet motor would be attached to and rotate with the rotating member. However, the rotating primary synchronous permanent magnet motor would continue to be designed to slide or actuate in a variable manner transversely or perpendicularly to the fixed synchronous stator member 25 as illustrated in FIG. 15.

The ferromagnetic back plate of the primary synchronous permanent magnet motor and the hermetically sealed conductive cover 11 as shown in FIG. 16 that attaches to the ferromagnetic back plate 2 will be constructed according to the linear version.

While particular embodiments have been illustrated and described herein, the invention is not limited to the aforementioned embodiments but instead is intended to embrace the full scope of the following claims.

What is claimed is:

1. A synchronous linear electrical machine operable as a motor or an electrodynamic brake, comprising
    an array of at least two permanent magnets arrange in alternating polarity; a ferromagnetic back plate having machined pockets to accept the permanent magnets in such a manner that will allow for highly accurate pole pitch spacing along the magnetic array, wherein said pockets surround and keep respective magnets in place;
    a one-piece ladder-type frame made of a non-ferromagnetic material; and
    one piece ladder-type frame made of a conductive material laminated to said one-piece ladder type frame made of a non-ferromagnetic material;
    a non-magnetic case in which said frames are welded, wherein said frames are blind drilled and tapped to create a bolt pattern that matches a bolt pattern of the ferromagnetic back plate.

2. The synchronous linear motor of claim 1, wherein the ferromagnetic back plate is made of material selected from the group consisting of structural type steel and electrical type steel.

3. The synchronous linear motor of claim 1 wherein said combination of ladder type frames further comprises ladder spacers parallel to the permanent magnet array providing precise pole-pitch alignment and secondary protection between each permanent magnet.

4. The synchronous linear motor of claim 1, wherein said combination of said ladder type frames acts as a spatial harmonic dampening device reducing spatial harmonics, leakage flux and flux fringing by at least 5%.

5. A synchronous linear electrical machine operable as an electrodynamic brake comprising a primary member, said primary member comprising:
    an array of at lest two permanent magnets, said magnets arranged in alternating polarity; and
    a secondary stator member,
    wherein said stator member is a one-piece non-layered or multi-layered conductive rail, and wherein said rail is slotted at a 90 degree angle, and said slots are spaced at a pre-determined pole pitch spacing.

6. A synchronous linear electrical machine operable as an electrodynamic brake comprising a primary member, said primary member comprising:
    an array of at least two permanent magnets, said magnets arranged in alternating polarity; and
    a secondary stator member,
    wherein said stator member is a one-piece non-layered or multi-layered conductive rail slotted to at least a 1 degree angle, and said slots are spaced at a pre-determined pole pitch spacing.

7. The system of claim 5 wherein the slots comprise a non-conductive insulating barrier around an inside edge of said slot and wherein the center of said slot comprises a highly permeable steel or ferrite core.

8. The system of claim 5 wherein the pole pitch spacing of the slots along the synchronous linear secondary stator member matches a negative and positive alternating magnet pole pitch spacing of the primary member.

9. A primary member comprising:
    a. a ferromagnetic back plate having pockets formed therein, said pockets spaced apart at a predetermined pole pitch spacing;
    b. an array of permanent magnets, said magnets respective to said pockets and arranged in alternating polarity, and said magnets magnetically secured to said back plate and positioned within said pockets; and
    c. a frame attached to said back plate, said frame having spaces therein corresponding to said magnets.

10. The primary member of claim 9 in combination with a secondary member made of at least one conductive material having slots defined therein such that the slots provide a pole pitch spacing substantially the same as the pole pitch spacing of the primary member, said combination comprising a synchronous linear motor.

11. The apparatus of claim 10, wherein said slots are disposed at a discrete angle relative to the orientation of the secondary member.

12. The apparatus of claim 10 wherein said apparatus comprises a linear machine.

13. The apparatus of claim 10 wherein said apparatus comprises a rotary machine.

14. The apparatus of claim 12 or 13 wherein said machine is synchronous.

15. The primary member of claim 9 wherein said frame is made of a conductive material.

16. The primary member of claim 9 wherein said frame is made of a non-conductive material.

17. The primary member of claim 9 wherein the frame comprise a frame assembly of a first frame member made of a non-ferromagnetic material, and a second frame member made of a conductive material, said second member laminated to said first member.

18. The primary member of claim 9 wherein said back plate is made of a material selected from the group consisting of structural type steel and electrical type steel.

19. The primary member of claim 9 wherein said frame is blind and drill tapped to create a bolt pattern to match a bolt pattern of the back plate.

20. The primary member of claim 9 wherein said back plate further comprises an o-ring groove machined into a surface of the back plate, said surface of the back plate facing a surface of the frame.

21. The primary member of claim 9 wherein said back plate further comprises an o-ring groove machined into a surface of the frame, said surface of the frame facing a surface of the back plate.

22. The primary member of claim 9 wherein said frame acts as a damper circuit, and wherein said frame in combination with said back plate surrounds and shades an outside and an upper portion of each magnet, thereby reducing spatial harmonics, leakage flux and flux fringe by at least 5%.

23. The primary member of claim 9 wherein said back plate comprises a bolt pattern, said bolt pattern comprising countersunk bolds surrounding each of said magnets.

24. A synchronous linear motor comprising:
    a. a primary member comprising an array of permanent magnets; and
    b. a secondary member, said secondary member comprising
        i. a rail made of a conductive material;
        ii. slots defined in said rail, said slots spaced apart wherein the distance between each slot corresponds to a pole pitch spacing of said permanent magnets.

25. The synchronous linear motor of claim 24 wherein said primary member further comprises:
  a. a ferromagnetic back plate having pockets formed therein, said pockets spaced apart at a predetermined pole pitch spacing;
  b. a frame attached to said back plate, said frame having spaces therein corresponding to said magnets,
  wherein said magnets are respective to said pockets and arranged in alternating polarity;
  wherein said magnets are magnetically secured to said back plate and positioned within said pockets.

26. The synchronous linear motor of claim 24 or 25 wherein said slots are disposed at an angle relative to an axis of the secondary member.

27. The synchronous linear motor of claim 26 wherein said angle is 90 degrees.

28. The synchronous linear motor of claim 26 wherein said angle is from about 1 to 10 degrees.

29. The synchronous linear motor of claim 24 or 25 wherein said rail further comprises at least two conductive materials, wherein said conductive materials are layered, wherein each layer comprises a respective conductive material.

30. The synchronous linear motor of claim 24 or 25 further comprising a ferrite core having dimension slightly smaller than that of said slot, said core placed inside of said slot.

31. The synchronous linear motor of claim 30 wherein a nonconductive barrier material is placed between core and the slot.

32. A synchronous linear motor comprising:
  a. a primary member comprising an array of permanent magnets; and
  b. a secondary member, said secondary member comprising
    i. a disc shaped stator made of a conductive material;
    ii. slots defined in said stator, said slots spaced apart wherein the distance between each slot corresponds to a pole pitch spacing of said permanent magnets.

33. The primary member of claim 24 or 32 wherein said back plate is disc shaped and said magnets are arranged in an arcuate orientation.

* * * * *

UNITED STATES PATENT AND TRADEMARK OFFICE
CERTIFICATE OF CORRECTION

| | | |
|---|---|---|
| PATENT NO. | : 6,930,413 B2 | Page 1 of 1 |
| APPLICATION NO. | : 10/444534 | |
| DATED | : August 16, 2005 | |
| INVENTOR(S) | : Domenic P. Marzano | |

It is certified that error appears in the above-identified patent and that said Letters Patent is hereby corrected as shown below:

Column 10, line 9, claim 32, "linear" should be --rotary--

Signed and Sealed this

Sixth Day of November, 2007

JON W. DUDAS
*Director of the United States Patent and Trademark Office*